(12) United States Patent
Lee et al.

(10) Patent No.: US 7,758,353 B2
(45) Date of Patent: Jul. 20, 2010

(54) CIRCUIT BOARD CONNECTOR ASSEMBLY AND METHOD FOR ASSEMBLING SUCH AN ASSEMBLY

(75) Inventors: Chee Hian Lee, Kedah (MY); David H. McClintock, Boynton Beach, FL (US); Chong Yeow Oo, Penang (MY)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 12/381,236

(22) Filed: Mar. 10, 2009

(65) Prior Publication Data
US 2009/0233467 A1 Sep. 17, 2009

(30) Foreign Application Priority Data
Mar. 14, 2008 (MY) .............................. PI20080673

(51) Int. Cl.
*H01R 12/00* (2006.01)
(52) U.S. Cl. ...................................... 439/76.1; 439/67
(58) Field of Classification Search .................. 439/67, 439/77, 76.1; 361/748–752
See application file for complete search history.

(56) References Cited

U.S. PATENT DOCUMENTS

| | | | | | |
|---|---|---|---|---|---|
| 4,585,284 | A | * | 4/1986 | Koser et al. | .................... 439/77 |
| 5,362,243 | A | * | 11/1994 | Huss et al. | ................. 439/76.1 |
| 6,655,017 | B1 | * | 12/2003 | Formwalt et al. | ............. 29/832 |
| 6,802,721 | B2 | * | 10/2004 | Sanada et al. | ................. 439/67 |
| 2004/0012940 | A1 | | 1/2004 | Kim et al. | |

* cited by examiner

*Primary Examiner*—Khiem Nguyen
(74) *Attorney, Agent, or Firm*—Anthony P. Curtis

(57) ABSTRACT

A circuit board connector assembly mounted in a housing and method of mounting are described. The assembly has orthogonal first and second circuit boards (CB). The CB has a CB connector containing a CB housing with CB electrical contacts. A flexible electrical link has a link connector mounted in a link connector housing with link electrical contacts. A resilient pad is mounted on a link connector housing and a flexible sheet is mounted to both the pad and the link. The sheet spans a length of the link. When the length of the link is substantially planar, the sheet provides a ramp tapering away from the pad. During mounting of the assembly in the housing, the CB connector is operatively coupled to the link connector thereby forming a first connector assembly, and an abutment edge of the second circuit board slidably engages the sheet thereby compressing the pad.

11 Claims, 8 Drawing Sheets

US 7,758,353 B2

CIRCUIT BOARD CONNECTOR ASSEMBLY AND METHOD FOR ASSEMBLING SUCH AN ASSEMBLY

PRIORITY

This application claims the benefit of priority under 35 U.S.C. §119 to Malaysian Application PI 2008 0673, filed Mar. 14, 2008 and herein incorporated by reference in its entirety.

TECHNICAL FIELD

The present invention relates generally to the field of circuit board connector assemblies and typically, but not exclusively, circuit board connector assemblies for compact electronic devices such as wireless-communications devices.

BACKGROUND

Typically, wireless-communications devices, such as cellular telephones or two-way radios have a housing containing electronic circuitry mounted on interconnected circuit boards. The interconnection of these circuit boards is generally facilitated by flexible electrical links (often called flex cables) that have electrical connectors engaging with respective connectors on the circuit boards to be interconnected.

Today's trend is to make wireless communications devices compact thereby resulting in space constrains inside the device's housing. Consequently, connector sizes are made a small as possible so that they do not occupy excessive areas on the circuit boards. Also, space saving configurations include circuit boards that are arranged so that they are mounted orthogonal to each other such that an edge of one of the circuit boards abuts and provides a retaining force to a resilient pad mounted to an electrical connector (link connector) on the flexible electrical link. This electrical connector is operatively engaged with a circuit board connector associated with an orthogonally mounted circuit board that has a plane orthogonal to the circuit board with the edge that provides the retaining force.

The abovementioned space saving configurations are compact and offer improved retention to the electrical connector that is abutted by the edge of one of the circuit boards, however, the assembly of such an arrangement typically requires a human production line operator (assembler) to use a tool to compress the resilient pad before the circuit board is positioned to provide the retention force. In order to assist in compressing the resilient pad, and then immediately positioning the edge of circuit board to abut this pad, the tool should be thin and narrow. Unfortunately, such a thin and narrow tool may have an edge or edges that are capable of cutting into or indenting the flexible electrical link, this may be a problem especially if care is not taken during production line assembly of the device. Further, when re-assembling the device, for example during maintenance or servicing the device, it is beneficial to use the thin and narrow tool to compress the resilient pad and thus again care should be taken so that the flexible electrical link is not cut or damaged.

BRIEF DESCRIPTION OF THE FIGURES

In order that the invention may be readily understood and put into practical effect, reference will now be made to exemplary embodiments as illustrated with reference to the accompanying figures, where like reference numerals refer to identical or functionally similar elements throughout the separate views. The figures together with a detailed description below, are incorporated in and form part of the specification, and serve to further illustrate the embodiments and explain various principles and advantages, in accordance with the present invention where.

DETAILED DESCRIPTION

Figure 1:
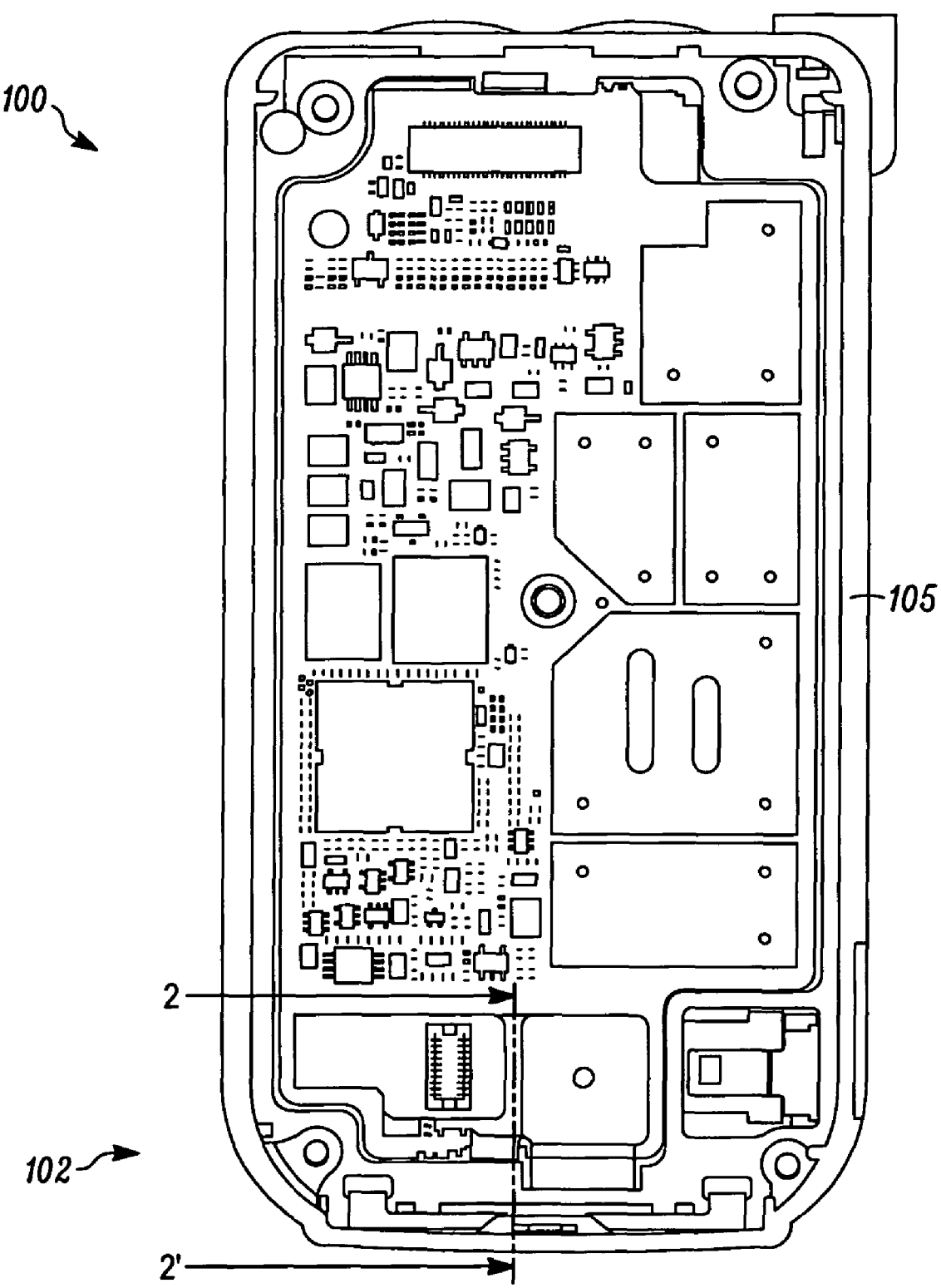
FIG. 1 illustrates a plan view of an electronic device with a circuit board connector assembly and housing in accordance with an embodiment of the invention.

Before describing in detail embodiments that are in accordance with the present invention, it should be observed that the embodiments reside primarily in combinations of circuit board connector assemblies and methods for assembling such assemblies. Accordingly, the electronic device and the antenna assembly have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that device components that comprises a list of elements does not include only those elements but may include other elements not expressly listed or inherent to such circuit board connector assemblies and methods for assembling such assemblies. An element proceeded by "comprises . . . a" does not, without more constraints, preclude the existence cover a non-exclusive inclusion, such that a circuit board connector assemblies and methods for assembling that comprises a list of elements does not include only those elements but may include other elements not expressly listed or inherent to such circuit board connector assemblies and methods for assembling such assemblies and of additional identical elements in the circuit board connector assemblies that comprises the element.

According to one aspect of the present invention there is provided a circuit board connector assembly mounted in a housing, the assembly comprising a first circuit board with a first circuit board connector. The first circuit board connector has a first circuit board connector housing with circuit board electrical contacts. A flexible electrical link has a link connector mounted housed in a link connector housing with link electrical contacts. There is a resilient pad mounted on the link connector housing and a flexible sheet is mounted to both the resilient pad and the flexible electrical link. The flexible sheet spans a spanned length of the flexible electrical link, wherein when the spanned length of the flexible electrical link is substantially planar the flexible sheet provides a ramp tapering away from the resilient pad. The circuit board connector assembly also has a second circuit board that is orthogonal to the first circuit board, wherein during mounting of the circuit board connector assembly in the housing the first circuit board connector is operatively coupled to the link connector thereby forming a first connector assembly, and an abutment edge of the second circuit board slidably engages the flexible sheet thereby compressing the resilient pad.

According to another aspect of the present invention there is provided method for assembling a circuit board connector assembly in a housing, the method comprising: mounting in the housing a first circuit board with a first circuit board connector thereon, the first circuit board connector having a first circuit board connector housing with circuit board electrical contacts; operatively coupling the first circuit board connector to the link connector of a flexible electrical link thereby forming a first connector assembly, the link connector having a resilient pad mounted to the link connector housing of the link connector and wherein there is a flexible sheet mounted to both the resilient pad and the flexible electrical link; maintaining the flexible electrical link taut; and mounting a second circuit board orthogonal to the first circuit board so that an abutment edge of the second circuit board slidably engages the flexible sheet thereby compressing the resilient pad.

Figure 2:
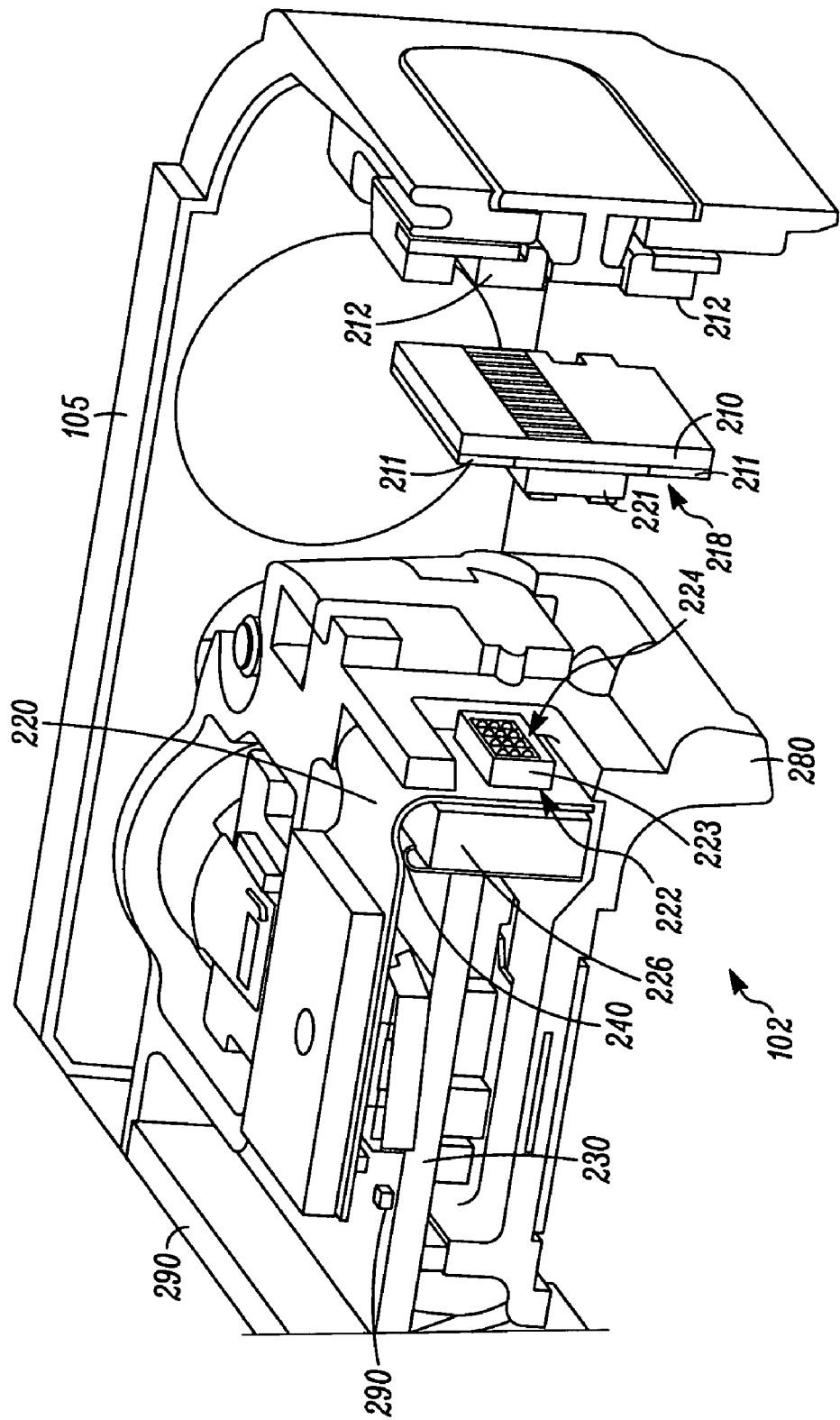
FIG. 2 illustrates a partially exploded cross sectional perspective view through 2-2' of FIG. 1 in accordance with an embodiment of the invention.

In FIG. 1 there is illustrated an electronic device 100 (without a front cover) that includes a circuit board connector assembly 102 mounted in a housing 105. Referring to FIG. 2, there is illustrated a partially exploded cross sectional perspective view of the circuit board connector assembly 102 and the housing 105 through 2-2' of FIG. 1. The circuit board connector assembly 102 includes a first circuit board 210 with a first circuit board connector 218 having a first circuit board connector housing 221 mounted on the first circuit board 210. The circuit board connector assembly 102 also includes flexible electrical link 220 (often called a flex cable or flex connector) and a second circuit board 230 to which is mounted interconnected electronic components 290.

As is well known in the art, the flexible electrical link 220 includes electrically conductive runners for electrically connecting electronic circuitry and components and there may be electronic components mounted on the flexible electrical link 220. Also, mounted on the flexible electrical link 220 is a link connector 222 that has a link connector housing 223 with link electrical contacts 224. A resilient pad 226 is mounted to the link connector housing 223, the resilient pad 226 is typically made from a Poron™ foam, manufactured by the Rogers Corporation, however, other foams or materials with resilient properties can be used for the resilient pad 226. More specifically, the mounting of the resilient pad 226 is accomplished by the resilient pad 226 being directly mounted to the flexible electrical link 220 which is directly mounted to the connector housing 223, therefore an area of the flexible electrical link 220 is sandwiched between the resilient pad 226 and the connector housing 223.

There is also a flexible sheet 240 with areas adjacent opposite ends of the flexible sheet 240 that are respectively to ends of the resilient pad 226 and the flexible electrical link 220. The first circuit board 210 has electrically insulating mounting pads 211 and when the first circuit board 210 is mounted to the housing 105 the first circuit board 210 abuts housing surfaces 212 and is retained in position by a chassis 280 that abuts the electrically insulating mounting pads 211. Further, the second circuit board 230 is mounted to the housing 105 via a chassis 280 and when so mounted the second circuit board 230 is orthogonal to the first circuit board 210.

As will be apparent to a person skilled in the art, in this embodiment the second circuit board 230 is a main circuit board (sometimes referred to as a Mother Board) and the first circuit board 210 is an auxiliary smaller board.

Figure 3:
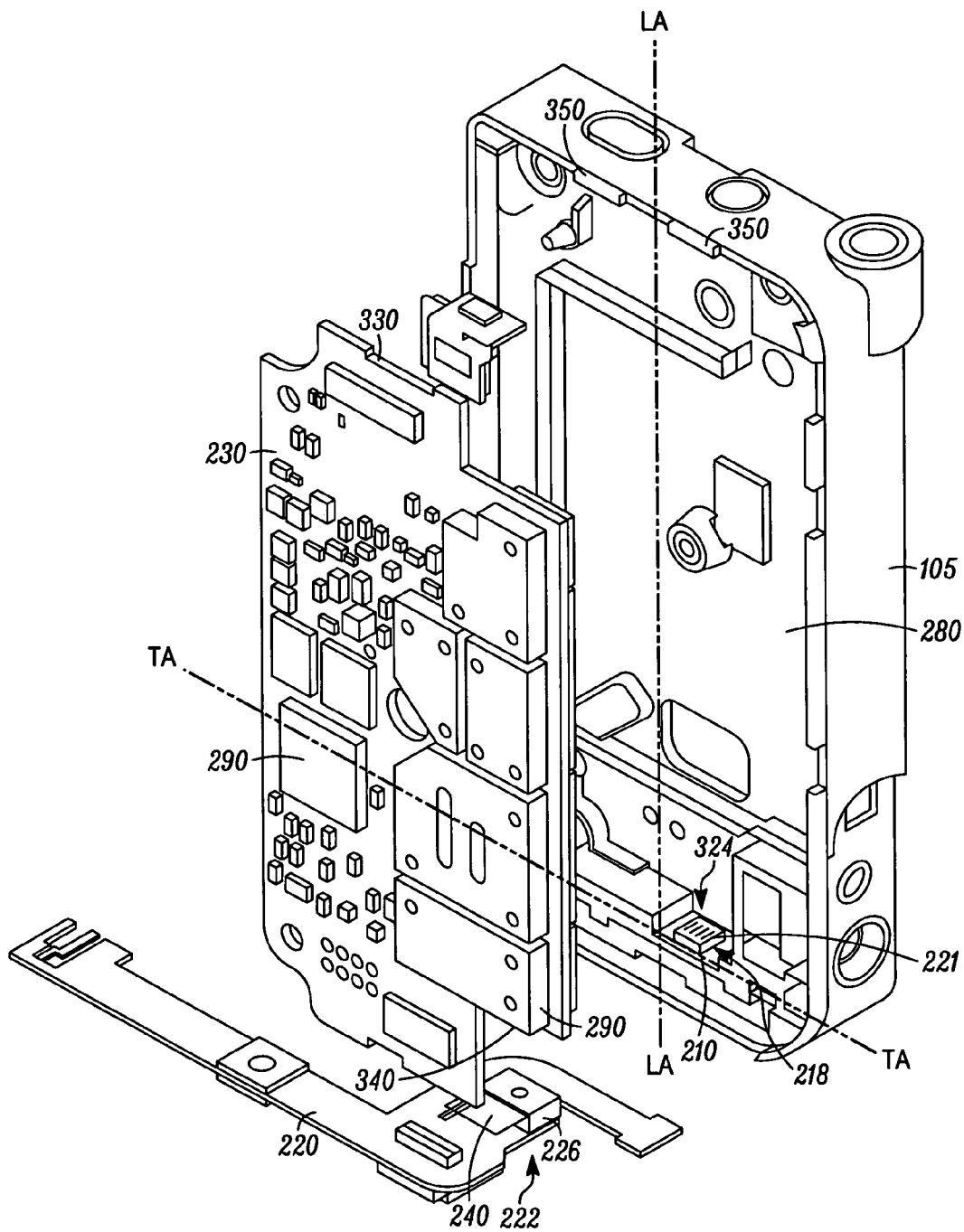
FIG. 3 illustrates a perspective view of the circuit board connector assembly before it is fully mounted in the housing in accordance with an embodiment of the invention.

Referring to FIG. 3, there is illustrated a perspective view of the circuit board connector assembly 102 before it is fully mounted in the housing 105. As illustrated, the first circuit board connector housing 221 has circuit board electrical contacts 324 for engaging with respective ones of the link electrical contacts 224. Also, the first circuit board 210 with the first circuit board connector 218 is mounted to the housing 105 and the second circuit board 230 has yet to be mounted to the chassis 280, housed and mounted to the housing 105. However, the relative orientations and approximate positions of the first circuit board 210 and second circuit board 230 are shown in which the second circuit board 230 is orthogonal to the first circuit board 210. Also, when mounted in the housing 105 a longitudinal axis TA of the first circuit board is transverse to the longitudinal axis LA of the housing 105.

The housing 105 has rims 350 projecting inwardly into a chamber of the housing 105 and the second circuit board 230 has a pivot edge 330 opposite an abutment edge 340. Also, a complete view of the flexible electrical link 220 when substantially planar is shown and when the flexible electrical link 220 substantially planar the flexible sheet 240 provides a ramp as more clearly shown in FIG. 4.

Figure 4:
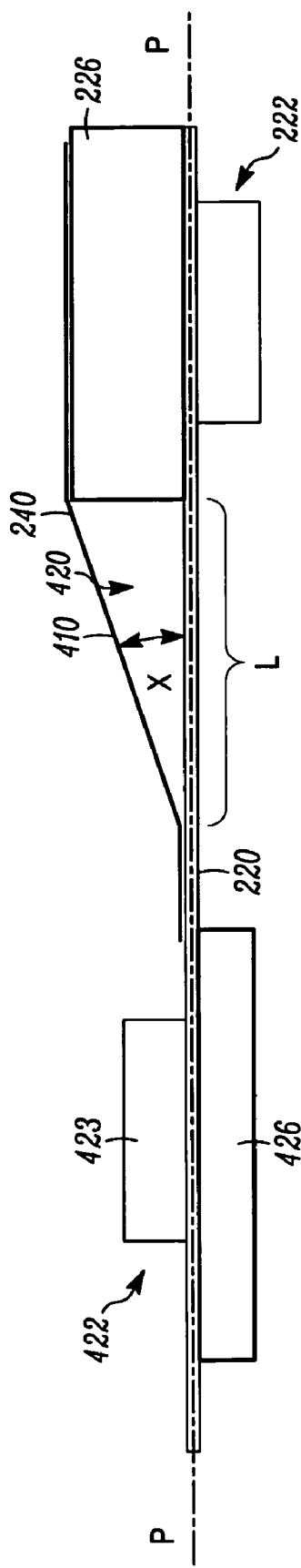
FIG. 4 illustrates a side view of part of a flexible electrical link of FIG. 3 in accordance with an embodiment of the invention.

Referring to FIG. 4, there is illustrated a side view of part of the flexible electrical link 220 when substantially planar and lying a plane indicated by dashed lines P. When the flexible electrical link 220 is substantially planar the flexible sheet 240 provides a ramp 410 spanning a spanned length L of the flexible electrical link 220. More specifically, the ramp 410 is spaced by a gap 420 from the flexible sheet 240 and the spanned length L is planar along plane P, therefore flexible sheet 240 provides the ramp 410 that is tapering away from the resilient pad 226 at an angle x. Also shown is another link connector 422 including another link connector housing 423 with electrical contacts (not shown) mounted on a side of the flexible electrical link 220. On the other side of the flexible electrical link 220 there is mounted a rigid pad 426 in alignment with the link connector housing 423. This rigid pad 426 is used as a support to which a force is applied when the link connector 222 is required to engage and couple with a corresponding connector on the second circuit board 230. This rigid pad 426 can also be gripped to assist in removing engagement of the link connector 222 from corresponding connector on the second circuit board 230 during servicing of the electronic device 100.

Figure 5:
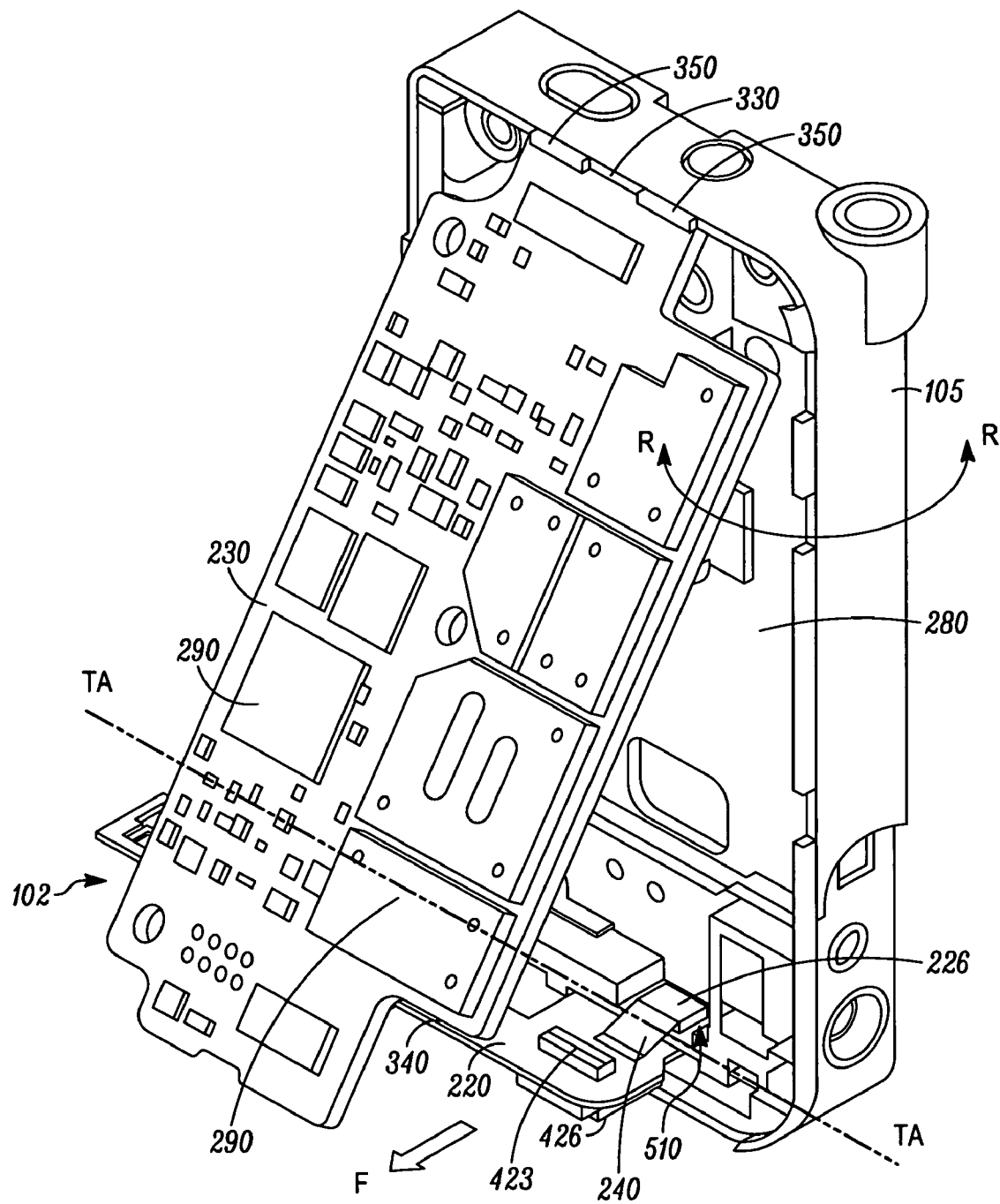
FIG. 5 illustrates a perspective view of the circuit board connector assembly partially mounted in the housing in accordance with an embodiment of the invention.

In FIG. 5 there is illustrated a perspective view of the circuit board connector assembly 102 partially mounted in the housing 105. When so partially mounted, the first circuit board connector 218 is operatively coupled to the link connector 222 thereby forming a first connector assembly 510. As illustrated, during the mounting of the circuit board connector assembly 102 in the housing 105, an area of the second circuit board 230 adjacent the pivot edge 330 engages rims 350 of the housing 105 and the second circuit board 230 pivots, shown by arrowed line R, relative to the housing 105 about the area of the second circuit board 230 adjacent the pivot edge 330. In addition, during the mounting of the circuit board connector assembly 102, the flexible electrical link 220 is held taut, typically by a human assembly operator, by the application of a pulling force F away from the first connector assembly 510. Thus, when the second circuit board 230 pivots towards the housing 105, shown by arrowed line R, the abutment edge 340 contacts the flexible sheet 240 and deforms the ramp 410. As the ramp 410 is deformed the gap 420 becomes smaller in volume and thereby compressing the resilient pad 226. As the abutment edge 340 gets closer to the resilient pad 226 there is a greater deformation of the ramp 410 causing a greater compressing of the resilient pad 226. Consequently, when the abutment edge 340 reaches the resilient pad 226, the movement of abutment edge 340 is not blocked by the resilient pad 226 and the abutment edge 340 can therefore be positioned to compress the resilient pad 226. This occurs after the abutment edge 340 has slid over the flexible sheet 240.

Figure 6:
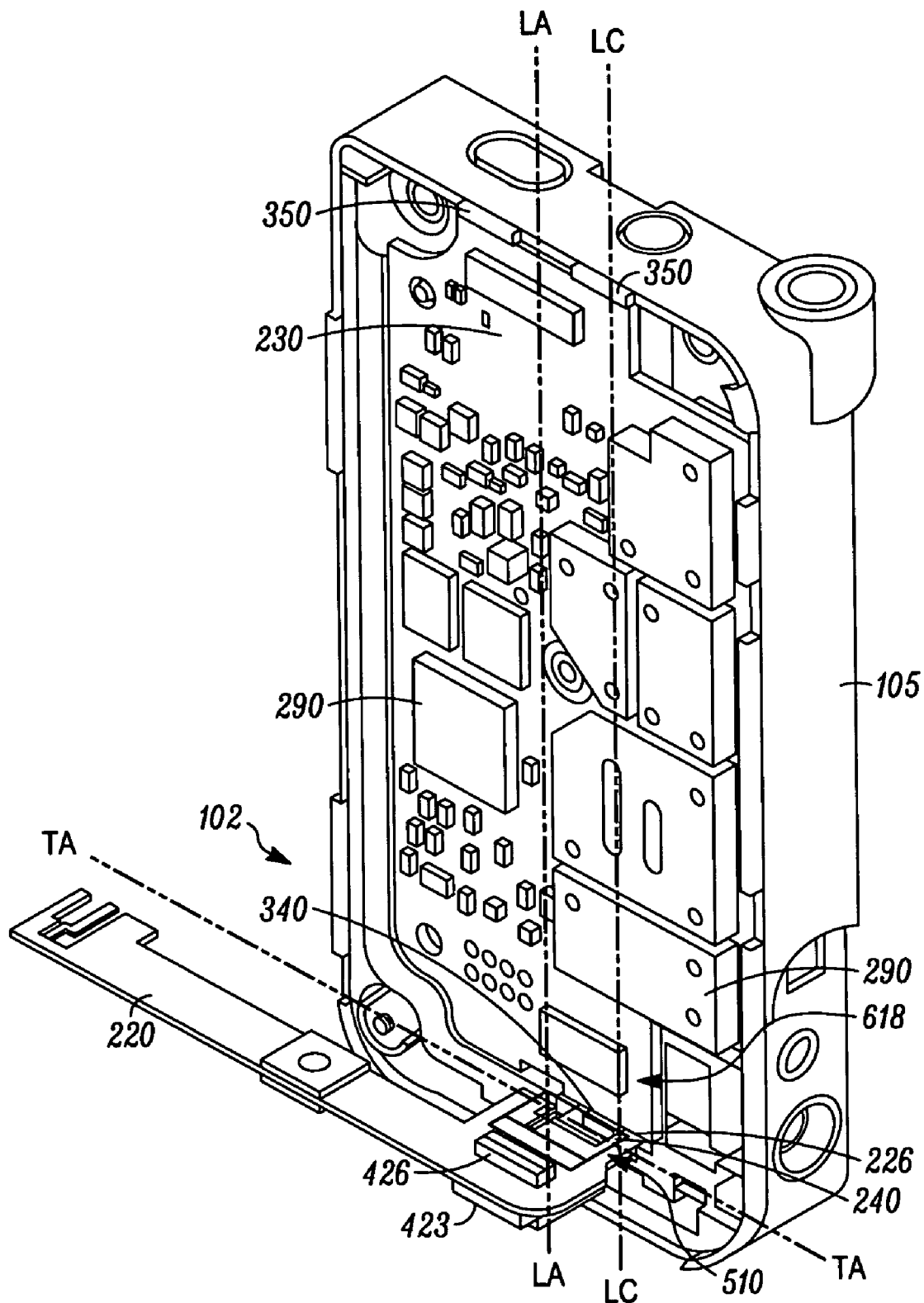
FIG. 6 illustrates a perspective view of the circuit board connector assembly mounted in the housing in accordance with an embodiment of the invention.

Referring to FIG. 6, there is illustrated a perspective view of the circuit board connector assembly 102 when mounted in the housing 105. When mounted, the second circuit board 230 is orthogonal to the first circuit board 210 and a second circuit board connector 618 is located on the second circuit board 230 so that it can be position for coupling with the another link connector 422. During mounting of the circuit board connector assembly 102 in the housing 105, the first circuit board connector 218 is operatively coupled to the link connector 222 thereby forming the first connector assembly 510. Also, as mentioned above, during mounting, the abutment edge 340 of the second circuit board 230 slidably engages the flexible sheet 240 thereby compressing the resilient pad 226. After the mounting the abutment edge 340 is aligned with the resilient pad 226 and thus provides for compressing the resilient pad 226 and the second circuit board 230 thereby provides a retaining force to the first connector assembly 510 in which the pivot edge 330 abuts an inner surface of the housing 105 and the abutment edge 340 abuts and provides a force against the resilient pad 226. As shown, when mounted in the housing the longitudinal axis LC of the second circuit board 230 is parallel with the longitudinal axis LA of the housing.

Figure 7:
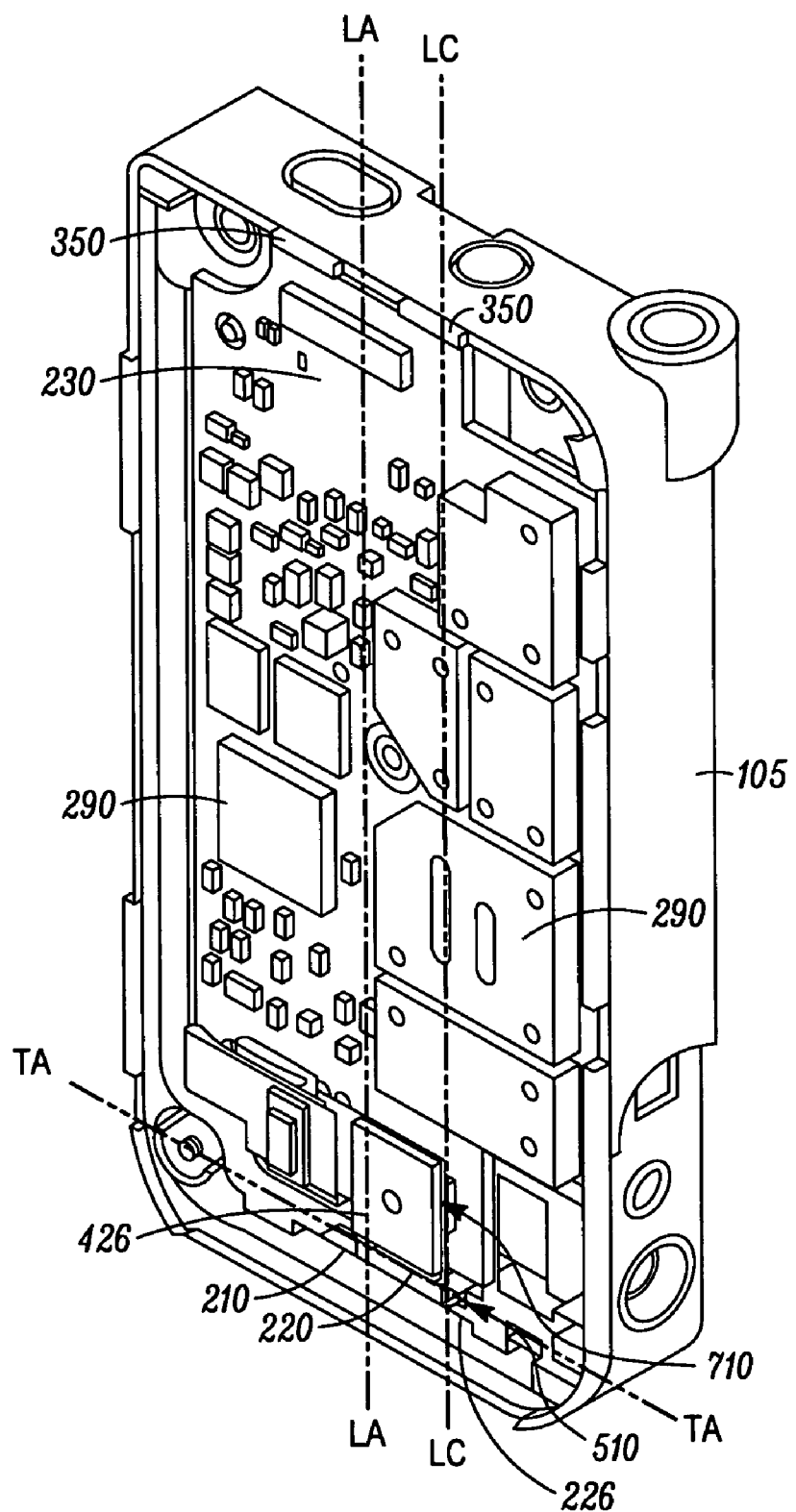
FIG. 7 illustrates a perspective view of the circuit board connector assembly mounted in the housing and electrically connecting two circuit boards in accordance with an embodiment of the invention.

In FIG. 7 there is illustrated circuit board connector assembly 102 mounted in the housing 105 and electrically connecting the first circuit board 210 and the second circuit board 230 via: the flexible electrical link 220, the first connector assembly 510 and a second connector assembly 710 (formed by coupling the second circuit board connector 618 and the another link connector 422). In this regard, when the compressing of the resilient pad 226 is provided by the abutment edge 340, the flexible electrical link 220 is bent towards the second circuit board 230 thereby collapsing the ramp 410 (better shown in FIG. 4). The remainder of the flexible electrical link 220 is bent and located to interconnect other components and circuit boards or interconnecting other components or circuit boards to the circuit boards 210, 230 of the electronic device 100 as will be apparent to a person skilled in the art.

Figure 8:
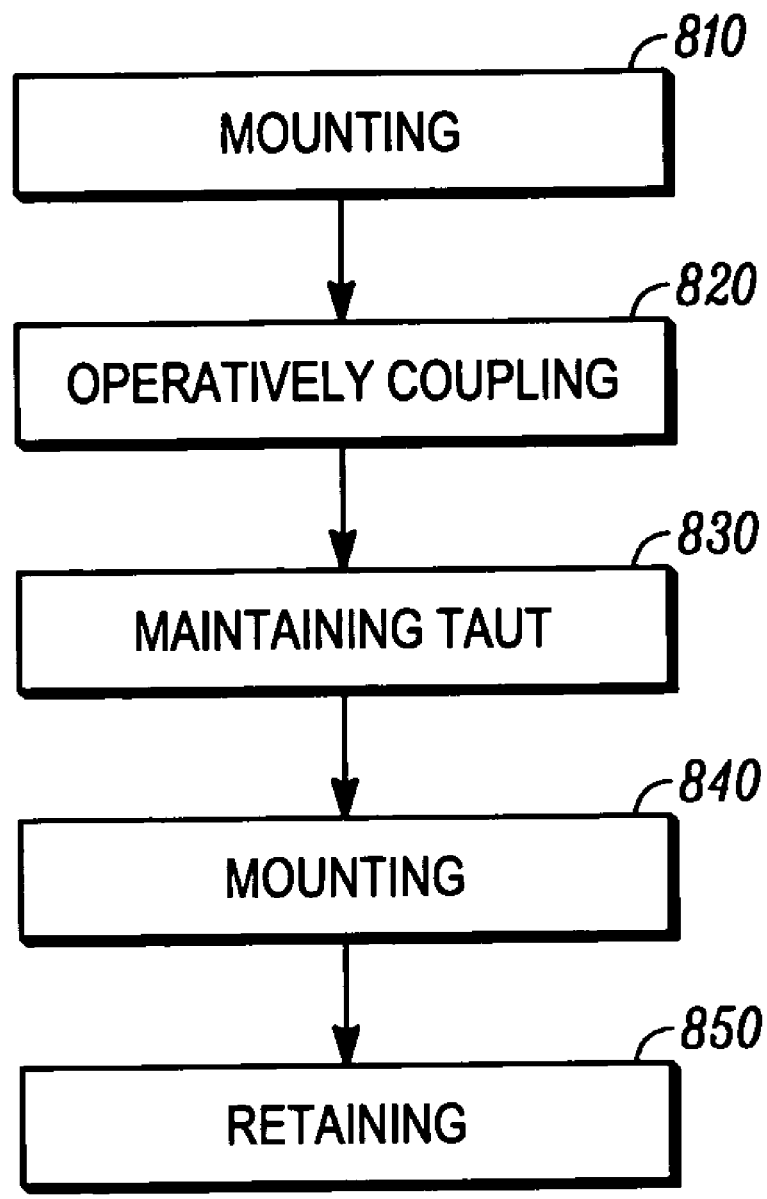
FIG. 8 illustrates a flow diagram of a method for assembling the circuit board connector assembly of FIG. 1 in accordance with an embodiment of the invention.

Referring to FIG. 8 there is illustrated a method 800 for assembling the circuit board connector assembly 102 in the housing 105. Firstly, at a mounting step 810 there is performed mounting in the housing 105 the first circuit board 210 that has a first circuit board connector 218 that includes the first circuit board connector housing 221 with circuit board electrical contacts 324. The completion of the mounting step 810 illustrated in FIG. 3. Next, there is performed an operatively coupling step 820 for operatively coupling the first circuit board connector 218 to the link connector 222 of a flexible electrical link 220 thereby forming the first connector assembly 510. The completion of the operatively coupling step 820 is illustrated in FIG. 5. A maintaining taut step 830 then maintains the flexible electrical link taut by the application of the pulling force F to the flexible electrical link 220 and then a second mounting step 840 provides for mounting the second circuit board 230 orthogonal to the first circuit board 210 so that the abutment edge 340 of the second circuit board 230 slidably engages the flexible sheet 240 thereby compressing the resilient pad 226. After completion of the second mounting step 840 a retaining step 850 occurs in which the abutment edge 340 is aligned with the resilient pad 226 and provides for compressing the resilient pad 226 and the second circuit board 230 thereby provides a retaining force to the first connector assembly 510. This retaining step 850 is illustrated in FIG. 6.

Advantageously, the present invention provides for alleviating the need for a thin and narrow tool to compress the resilient pad during assembly or servicing. Use of such a tool requires carte so that its potentially sharp edges do not cut or otherwise damage the flexible electrical link. In contrast, the ramp 410 replaces the need for such a tool and therefore the possibility of damage the flexible electrical link this tool is alleviated.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims.

We claim:

1. A method for assembling a circuit board connector assembly in an assembly housing, the method comprising:
  mounting in the assembly housing a first circuit board with a first circuit board connector thereon, the first circuit board connector having a first circuit board connector housing with circuit board electrical contacts;
  operatively coupling the first circuit board connector to the link connector of a flexible electrical link thereby forming a first connector assembly, the link connector having a resilient pad mounted to a link connector housing of the link connector, a flexible sheet mounted to both the resilient pad and the flexible electrical link;
  maintaining the flexible electrical link taut; and
  mounting a second circuit board orthogonal to the first circuit board so that an abutment edge of the second circuit board slidably engages the flexible sheet thereby compressing the resilient pad.

2. The method of claim 1, wherein after the mounting, the abutment edge is aligned with the resilient pad and provides for compressing the resilient pad and the second circuit board thereby providing a retaining force to the first connector assembly.

3. The method of claim 1, wherein when the flexible electrical link is substantially planar, the flexible sheet provides a ramp tapering away from the resilient pad.

4. The method of claim 3, wherein when mounted in the assembly housing, a longitudinal axis of the second circuit board is parallel with a longitudinal axis of the assembly housing.

5. The method of claim 4, wherein when mounted in the assembly housing, a longitudinal axis of the first circuit board is transverse to the longitudinal axis of the assembly housing.

6. The method of claim 5, wherein the second circuit board is a mother board.

7. The method of claim 6, wherein the second circuit board is an auxiliary circuit board.

8. The method of claim 5, wherein during mounting of the circuit board connector assembly in the assembly housing, the abutment edge deforms the ramp thereby compressing the resilient pad.

9. The method of claim 3, wherein when the compressing of the resilient pad is provided by the abutment edge, the flexible electrical link is bent towards the second circuit board thereby collapsing the ramp.

10. The method of claim 1, wherein the flexible electrical link and second circuit board are electrically coupled by a second connector assembly.

11. The method of claim 1, wherein the second circuit board has a pivot edge that is opposite the abutment edge and during the mounting of the circuit board connector assembly in the assembly housing, the second circuit board pivots relative to the assembly housing about the pivot edge.

* * * * *